US012261117B2

United States Patent
Yamaji et al.

(10) Patent No.: US 12,261,117 B2
(45) Date of Patent: Mar. 25, 2025

(54) SEMICONDUCTOR DEVICE AND METHOD OF MANUFACTURING THE SAME

(71) Applicant: FUJI ELECTRIC CO., LTD., Kawasaki (JP)

(72) Inventors: Masaharu Yamaji, Matsumoto (JP); Taichi Karino, Matsumoto (JP); Hitoshi Sumida, Matsumoto (JP); Hideaki Itoh, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 687 days.

(21) Appl. No.: 17/483,181

(22) Filed: Sep. 23, 2021

(65) Prior Publication Data
US 2022/0013466 A1 Jan. 13, 2022

Related U.S. Application Data

(63) Continuation of application No. PCT/JP2020/032447, filed on Aug. 27, 2020.

(30) Foreign Application Priority Data

Oct. 18, 2019 (JP) ................. 2019-190824

(51) Int. Cl.
*H01L 23/532* (2006.01)
*H01L 21/768* (2006.01)
*H03K 17/567* (2006.01)

(52) U.S. Cl.
CPC .. *H01L 23/53223* (2013.01); *H01L 21/76832* (2013.01); *H01L 21/76834* (2013.01); *H03K 17/567* (2013.01)

(58) Field of Classification Search
CPC ......... H01L 23/53223; H01L 21/76832; H01L 21/76834; H01L 2224/0239;
(Continued)

(56) References Cited

U.S. PATENT DOCUMENTS 8,102,050 B2 1/2012 Sasaki et al.
8,390,134 B2 3/2013 Homma et al.
(Continued)

FOREIGN PATENT DOCUMENTS

JP 2205323 A 8/1990
JP 3292757 A 12/1991
(Continued)

OTHER PUBLICATIONS

Office Action dated Apr. 19, 2024 for corresponding Chinese patent application No. 202080026801.9.
(Continued)

*Primary Examiner* — Karen Kusumakar

(57) ABSTRACT

A semiconductor device includes: a wiring layer; a titanium nitride layer deposited on the wiring layer; a titanium oxynitride layer deposited on the titanium nitride layer; a titanium oxide layer deposited on the titanium oxynitride layer; and a surface passivation film deposited on the titanium oxide layer, wherein an opening penetrating the titanium nitride layer, the titanium oxynitride layer, the titanium oxide layer, and the surface passivation film is provided to expose a part of the wiring layer so as to serve as a pad.

8 Claims, 15 Drawing Sheets

(58) Field of Classification Search
CPC ............. H01L 23/3157; H01L 24/03; H01L 2224/0235; H01L 24/02; H01L 2224/0345; H01L 23/291; H01L 24/05; H01L 2224/0391; H01L 2224/04042; H01L 2224/05567; H01L 2224/05624; H01L 23/53295; H01L 23/522; H01L 24/11; H01L 24/13; H01L 2224/10; H01L 2224/11; H03K 17/567; H03K 2217/0063; H03K 2217/0081; H02M 7/003; H02M 1/08; H02M 7/5387
See application file for complete search history.

(56) References Cited

U.S. PATENT DOCUMENTS

| | | | |
|---|---|---|---|
| 8,435,888 | B2 | 5/2013 | Sasaki et al. |
| 8,716,122 | B2 | 5/2014 | Honma et al. |
| 10,727,180 | B2 | 7/2020 | Karino et al. |
| 2009/0174076 | A1* | 7/2009 | Sasaki ............... H01L 24/04 438/653 |
| 2010/0295044 | A1* | 11/2010 | Homma ............. H01L 23/562 257/773 |
| 2012/0088364 | A1 | 4/2012 | Sasaki et al. |
| 2012/0111395 | A1* | 5/2012 | Kim ............... H01L 31/03921 438/94 |
| 2013/0149855 | A1 | 6/2013 | Homma et al. |
| 2019/0181089 | A1 | 6/2019 | Karino et al. |

FOREIGN PATENT DOCUMENTS

| | | | |
|---|---|---|---|
| JP | 4212459 | A | 8/1992 |
| JP | 11-95009 | A | 4/1999 |
| JP | 3460417 | B2 | 10/2003 |
| JP | 200988381 | A | 4/2009 |
| JP | 2010272621 | A | 12/2010 |
| JP | 5443827 | B2 | 12/2013 |
| JP | 5702844 | B2 | 2/2015 |
| JP | 2019106485 | A | 6/2019 |

OTHER PUBLICATIONS

Written Opinion of the International Searching Authority dated Nov. 24, 2020 from International Application No. PCT/JP2020/032447, 3 pages.

International Search Report dated Nov. 24, 2020 from International Application No. PCT/JP2020/032447, 4 pages.

* cited by examiner

US 12,261,117 B2

SEMICONDUCTOR DEVICE AND METHOD OF MANUFACTURING THE SAME

CROSS-REFERENCE TO RELATED APPLICATION

This application is a Continuation of PCT Application No. PCT/JP2020/032447, filed on Aug. 27, 2020, and claims the priority of Japanese Patent Application No. 2019-190824, filed on Oct. 18, 2019, the contents of each of which are incorporated herein by reference.

BACKGROUND

1. Field of the Invention

The present invention relates to a semiconductor device and a method of manufacturing the semiconductor device.

2. Description of the Related Art

Semiconductor devices such as a semiconductor integrated circuit (IC) are known that includes an anti-reflection film formed of a titanium nitride (TiN) film and the like on a wiring layer formed of material such as aluminum (Al) provided on a semiconductor substrate so as to reduce reflection (halation) of light from a base when forming a resist pattern for delineating the wiring layer (refer to Patent Literature 1: JP H03-292757, Patent Literature 2: JP H02-205323, Patent Literature 3: JP 5443827, Patent Literature 4: JP 5702844, and Patent Literature 5: JP 3460417).

Patent Literature 1 to Patent Literature 4 disclose that a single TiN film is provided as an anti-reflection film on a wiring layer.

Patent Literature 5 discloses a laminated structure including a titanium (Ti) layer provided as a lower layer and a TiN film provided as an upper layer in which a compositional rate continuously changes on a wiring layer.

Patent Literature 6, JP 2009-88381 does not mention an anti-reflection film provided on a wiring layer, but discloses a barrier metal film provided under a wiring layer and having a three-layer structure including a TiN film interposed between Ti films.

As disclosed in Patent Literature 1 to Patent Literature 5, a surface passivation film is provided on the anti-reflection film. An opening penetrating the surface passivation film and the anti-reflection film is provided to expose a part of the wiring layer so as to serve as a pad to be connected with a bonding wire. An edge of the TiN layer serving as the anti-reflection film is exposed on a side wall of the opening. The exposure of the edge of the TiN layer on the side wall of the opening under a temperature-humidity-bias (THB) environment leads TiN to react with moisture to cause titanium oxide (TiO), leading to volume expansion. The volume expansion is presumed to cause cracks or voids in the surface passivation film to result in faults such as corrosion at the circumference of the pad.

Patent Literature 2 to Patent Literature 4 disclose that the edge of the TiN layer is retreated from the opening by an etching step different from an etching step for pad forming to cover the edge of the TiN layer with the surface passivation film so as not to expose the TiN layer on the side wall of the pad opening.

SUMMARY

In view of the foregoing problems, the present invention provides a semiconductor device and a method of manufacturing the semiconductor device capable of avoiding a decomposition reaction of an anti-reflection film provided on a semiconductor substrate and corrosion of a wiring layer so as to improve reliability of the product.

An aspect of the present invention inheres in a semiconductor device including: a wiring layer; a titanium nitride layer deposited on the wiring layer; a titanium oxynitride layer deposited on the titanium nitride layer; a titanium oxide layer deposited on the titanium oxynitride layer; and a surface passivation film deposited on the titanium oxide layer.

Another aspect of the present invention inheres in a method for manufacturing a semiconductor device including: depositing a metal film for wiring formation on a semiconductor substrate; depositing a titanium nitride layer on the metal film for wiring formation; depositing a titanium layer on the titanium nitride layer; forming a resist pattern on the titanium layer; delineating the metal film for wiring formation by use of the resist pattern as an etching mask to form a wiring layer; oxidizing a top surface of the titanium layer to form a titanium oxide layer; diffusing oxygen and nitrogen into the titanium layer to form a titanium oxynitride layer between the titanium nitride layer and the titanium oxide layer; and forming a surface passivation film on the titanium oxide layer.

DESCRIPTION OF THE EMBODIMENTS

Figure 1:
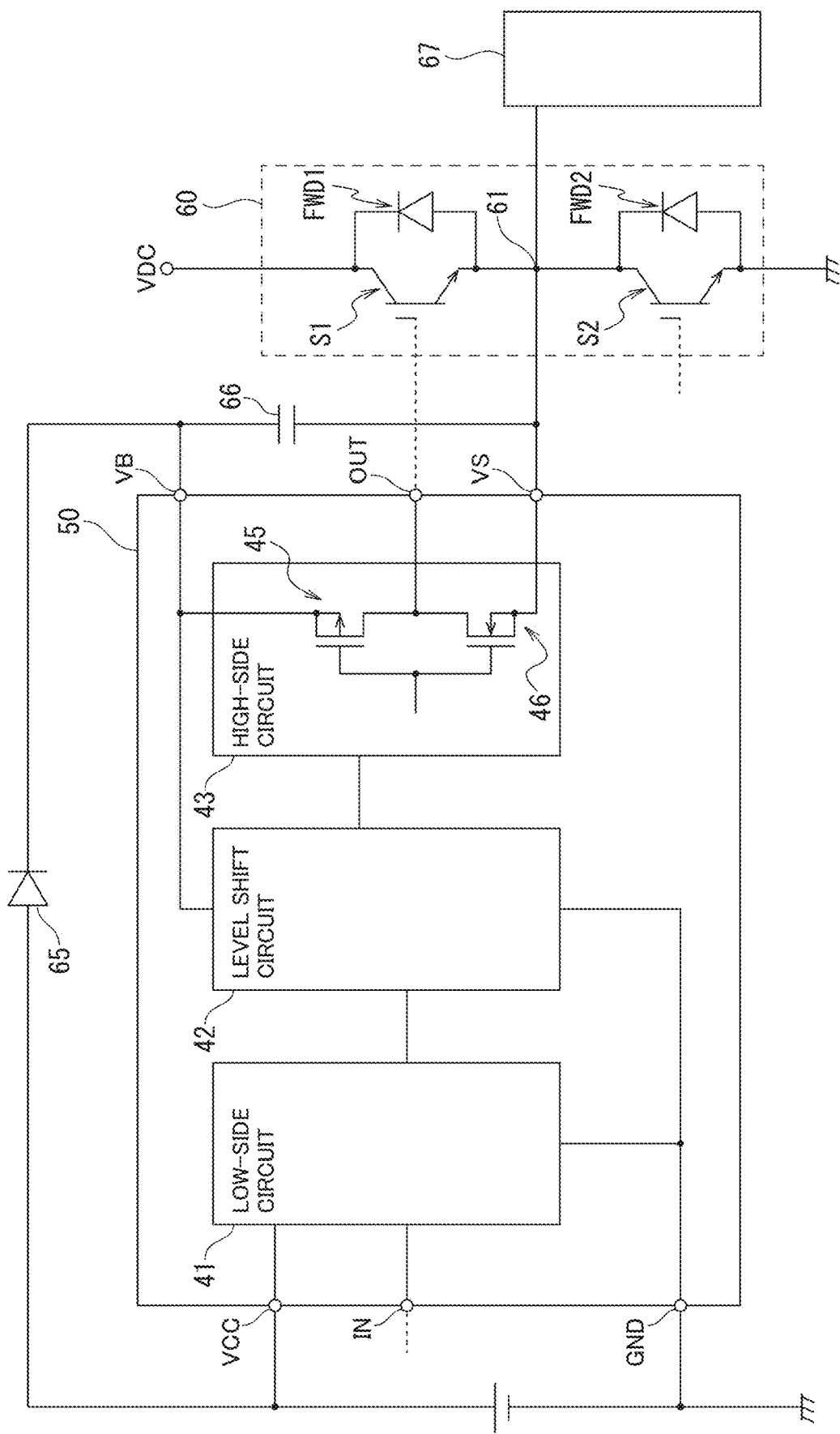
FIG. 1 is an equivalent circuit diagram illustrating a semiconductor device according to a first embodiment of the present invention.

With reference to the Drawings, first and second embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

First Embodiment

<Configuration of Semiconductor Device>

A semiconductor device according to a first embodiment of the present invention is illustrated below with a high voltage integrated circuit (referred to below as a "HVIC") that drives power switching elements implementing a bridge circuit for power conversion and the like. The semiconductor device 50 according to the first embodiment of the present invention drives a power converter 60 for one phase of the bridge circuit for power conversion, for example, as illustrated in FIG. 1. The power converter 60 includes a high-voltage-side switching element S1 and a low-voltage-side switching element S2 connected in series to implement an output circuit.

While FIG. 1 illustrates a case in which the high-voltage-side switching element S1 and the low-voltage-side switching element S2 are each an IGBT, the high-voltage-side switching element S1 and the low-voltage-side switching element S2 are not limited to the IGBT, and may be any other power switching elements such as a MOSFET. The high-voltage-side switching element Si is connected antiparallel to a freewheeling diode FWD1, and the low-voltage-side switching element S2 is connected antiparallel to a freewheeling diode FWD2. The present embodiment may also be applied to a case of a reverse-conducting IGBT in which the high-voltage-side switching element S1 and the freewheeling diode FWD1 are integrated in one chip, and the low-voltage-side switching element S2 and the freewheeling diode FWD2 are integrated in another chip.

The high-voltage-side switching element Si and the low-voltage-side switching element S2 are connected between a high-voltage main power supply VDC on the positive electrode side and a ground potential (a GND potential) on the negative electrode side with respect to the main power supply VDC so as to implement a half bridge circuit. A high-level electrode terminal (a collector terminal) of the high-voltage-side switching element S1 is connected to the main power supply VDC, and a low-level electrode terminal (an emitter terminal) of the low-voltage-side switching element S2 is connected to the GND potential. A connection point 61 between a low-level electrode terminal (an emitter terminal) of the high-voltage-side switching element S1 and a high-level electrode terminal (a collector terminal) of the low-voltage-side switching element S2 is an output point of the power converter 60 for one phase of the bridge circuit for power conversion. The connection point 61 is connected to a load 67 such as a motor, and a VS potential at a reference voltage terminal VS is supplied to the load 67.

The semiconductor device 50 according to the first embodiment of the present invention outputs, from an output terminal OUT, a drive signal for turning on/off a gate of the high-voltage-side switching element S1 so as to drive in accordance with an input signal input from an input terminal IN. The semiconductor device 50 according to the first embodiment of the present invention includes at least a low-potential-side circuit (a low-side circuit) 41, a level shift circuit 42, and a high-potential-side circuit (a high-side circuit) 43 as a part of the entire circuit. The low-side circuit 41, the level shift circuit 42, and the high-side circuit 43 may be monolithically integrated in a single semiconductor chip (a semiconductor substrate), for example. Alternatively, elements implementing the low-side circuit 41, the level shift circuit 42, and the high-side circuit 43 may be separately integrated in two or more semiconductor chips.

The low-side circuit 41 operates with the GND potential used as a reference potential applied to a ground terminal GND and with a VCC potential used as a power supply potential applied to a low-level-side power supply terminal VCC. The low-side circuit 41 generates an ON/OFF signal at a low-side level to output the signal to the level shift circuit 42 in accordance with the input signal input from the input terminal IN. The low-side circuit 41 may include a complementary MOS (CMOS) circuit (not illustrated) including an nMOS transistor and a pMOS transistor, for example.

The level shift circuit 42 operates with the GND potential used as a reference potential applied to the ground terminal GND. The level shift circuit 42 converts the ON/OFF signal at the low-side level output from the low-side circuit 41 to an ON/OFF signal at a high-side level used on the high side. The level shift circuit 42 may include an nMOS transistor to serve as a level shifter, a level shift resistor, and a protection diode (not illustrated).

The high-side circuit 43 operates with the VS potential used as a reference potential applied to the reference voltage terminal VS and with a VB potential used as a power supply potential that is a first potential applied to a high-level-side power supply terminal VB. The high-side circuit 43 outputs the drive signal through the output terminal OUT in accordance with the ON/OFF signal output from the level shift circuit 42 so as to drive a gate of the high-voltage-side switching element S1. The high-side circuit 43 includes a CMOS circuit at the output stage including an nMOS transistor 46 as an active element and a pMOS transistor 45 as an active element. A source terminal of the pMOS transistor 45 is connected to the high-level-side power supply terminal VB. A source terminal of the nMOS transistor 46 is connected to the reference voltage terminal VS. The output terminal OUT is connected between a drain terminal of the pMOS transistor 45 and a drain terminal of the nMOS transistor 46.

The semiconductor device 50 according to the first embodiment of the present invention is illustrated with a bootstrap circuit type. The configuration illustrated in FIG. 1 includes a bootstrap diode 65 which is an external element connected between the low-level-side power supply terminal VCC and the high-level-side power supply terminal VB. A bootstrap capacitor 66 which is an external element is connected between the high-level-side power supply terminal VB and the reference voltage terminal VS. The bootstrap diode 65 and the bootstrap capacitor 66 implement a part of the circuit of the drive power supply of the high-voltage-side switching element S1.

The VB potential is the highest potential applied to the semiconductor device 50, and is kept at a level higher than the VS potential as a second potential by about 5 to 15 volts due to the bootstrap capacitor 66 in a normal state of not being affected by noise. The VS potential is repeatedly raised and dropped between the high-potential-side potential of the main power supply VDC (for example, about 400 volts or greater and 2000 volts or lower) and the low-potential-side potential (the GND potential) by complementarily turning on/off the high-voltage-side switching element S1 and the low-voltage-side switching element S2, and varies from zero to several hundreds of volts. The VS potential can be a negative potential. The potential of the low-level-side power supply terminal VCC is about 5 to 15 volts.

Figure 2:
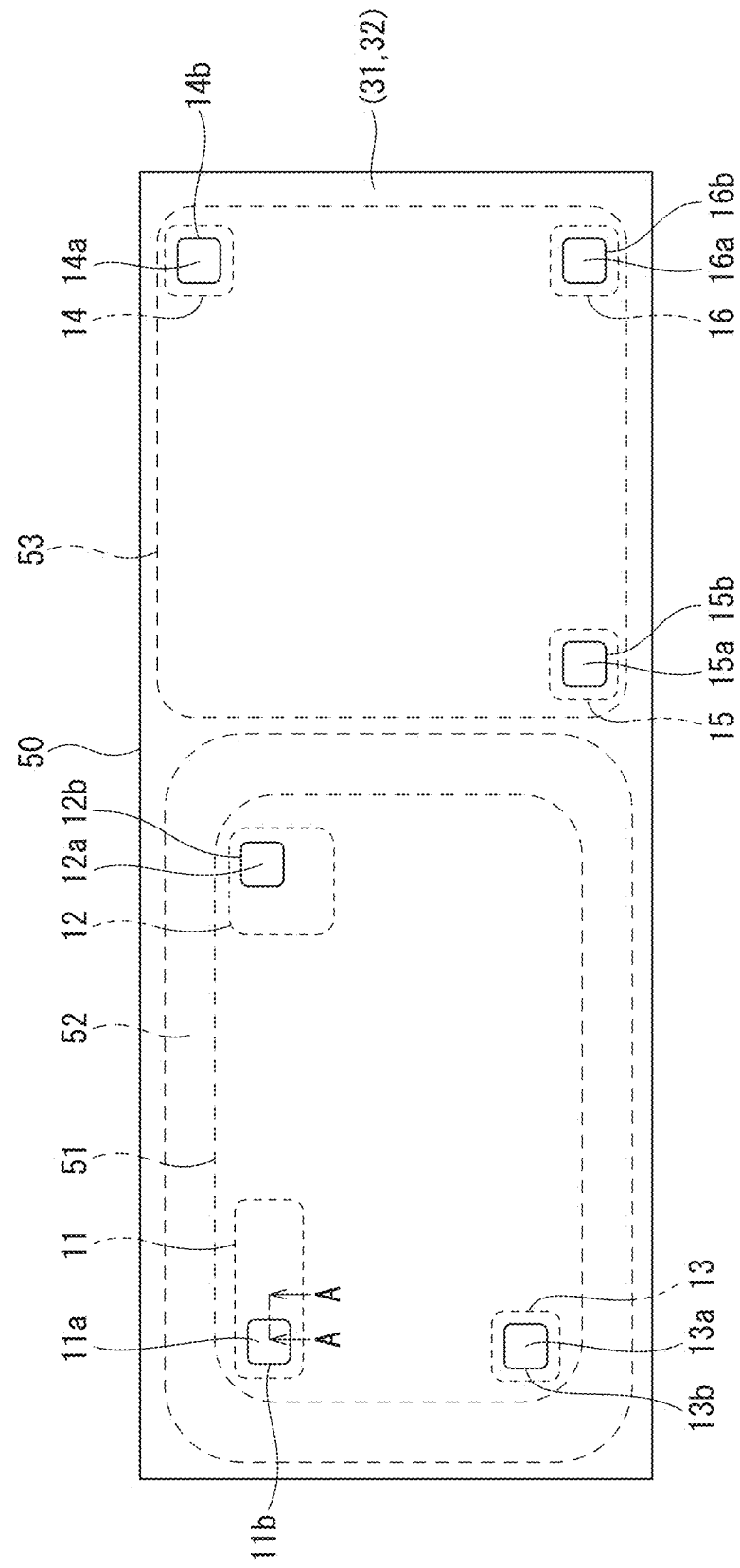
FIG. 2 is a schematic plan view illustrating the semiconductor device according to the first embodiment of the present invention.

FIG. 2 is a view illustrating a schematic planar layout of the semiconductor device 50 illustrated in FIG. 1. The semiconductor device 50 according to the first embodiment of the present invention includes a high-potential-side circuit area (a high-side circuit area) 51 and a low-potential-side circuit area (a low-side circuit area) 53 integrated in a single chip. A structure of high voltage junction termination (HVJT) 52 is arranged at the circumference of the high-side circuit area 51.

The high-side circuit area 51 illustrated in FIG. 2 includes elements such as a semiconductor element and a passive element (not illustrated). The type, the number, and the positional relationship of the elements included in the high-side circuit area 51 can be determined as appropriate. The high-side circuit area 51 includes a plurality of pads (high-potential-side pads) 11*a*, 12*a*, and 13*a* that can be connected to a bonding wire. The respective high-potential-side pads 11*a*, 12*a*, and 13*a* are implemented by a part of high-potential-side wiring layers 11, 12, and 13 exposed on openings 11*b*, 12*b*, and 13*b* in a surface passivation film (31, 32). The high-side circuit area 51 corresponds to the high-side circuit 43 illustrated in FIG. 1, and the respective high-potential-side pads 11*a*, 12*a*, and 13*a* correspond to the high-level-side power supply terminal VB, the output terminal OUT, and the reference voltage terminal VS illustrated in FIG. 1, for example.

The HVJT 52 electrically separates the high-side circuit area 51 from the low-side circuit area 53. The HVJT 52 can include a breakdown voltage structure of the level shift elements implementing the level shift circuit 42 illustrated in FIG. 1.

The low-side circuit area 53 illustrated in FIG. 2 includes elements such as a semiconductor element and a passive element (not illustrated). The type, the number, and the positional relationship of the elements included in the low-side circuit area 53 can be determined as appropriate. The low-side circuit area 53 includes a plurality of pads (low-potential-side pads) 14*a*, 15*a*, and 16*a* that can be connected to the bonding wire. The respective low-potential-side pads 14*a*, 15*a*, and 16*a* are implemented by a part of low-potential-side wiring layers 14, 15, and 16 exposed on openings 14*b*, 15*b*, and 16*b* in the surface passivation film (31, 32). The low-side circuit area 53 corresponds to the low-side circuit 41 illustrated in FIG. 1, and the respective low-potential-side pads 14*a*, 15*a*, and 16*a* correspond to the low-level-side power supply terminal VCC, the input terminal IN, and the ground terminal GND illustrated in FIG. 1, for example.

In the present specification, the plural high-potential-side wiring layers 11, 12, and 13 and the plural low-potential-side wiring layers 14, 15, and 16 are each collectively referred to as a "wiring layer" when the spatial positions or the shapes of the wiring layers are not distinguished from each other. Similarly, in the present specification, the plural high-potential-side pads 11*a*, 12*a*, and 13*a* and the plural low-potential-side pads 14*a*, 15*a*, and 16*a* are each collectively referred to as a "pad" when the spatial positions or the like are not distinguished from each other.

Figure 3:
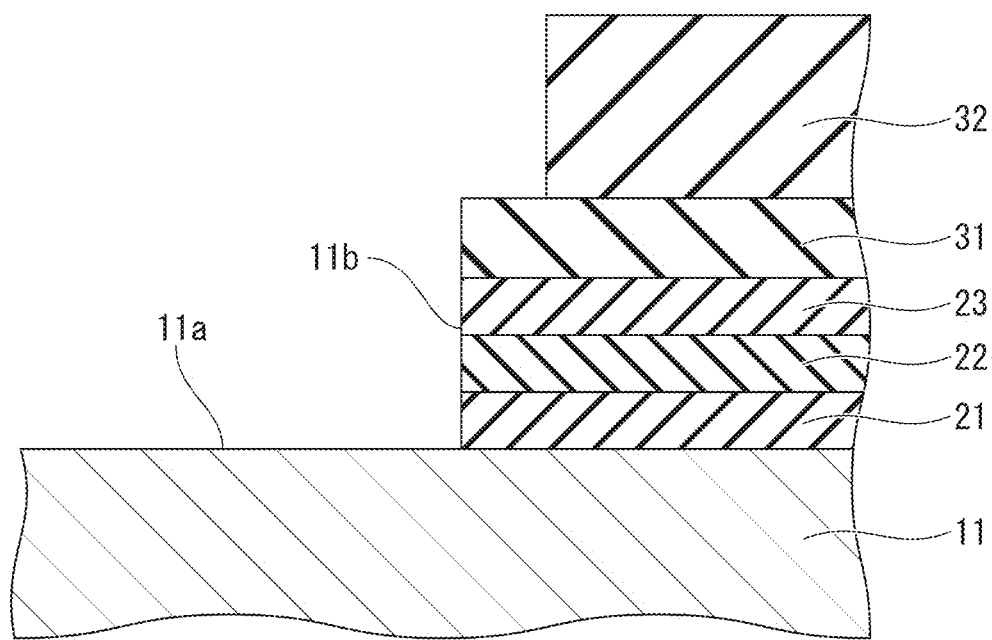
FIG. 3 is a cross-sectional view taken along line A-A in FIG. 2.

FIG. 3 is an upper cross-sectional view as viewed from A-A direction in FIG. 2 particularly illustrating the circumference of the high-potential-side pad 11*a* among the plural high-potential-side pads 11*a*, 12*a*, and 13*a* included in the high-side circuit area 51.

The semiconductor device 50 according to the first embodiment of the present invention includes the high-potential-side wiring layer 11 serving as the high-potential-side pad 11*a*, as illustrated in FIG. 3. The high-potential-side wiring layer 11 is one of the high-potential-side wiring layers 11, 12, and 13 located at the uppermost layer of the multi-layer wiring structure on the semiconductor substrate. The high-potential-side wiring layer 11 has a thickness of about 600 nanometers or greater and 2000 nanometers or less, for example. The high-potential-side wiring layer 11 may be made of a metallic material such as aluminum (Al) or an Al alloy mainly including Al. An example of the Al alloy is Al-silicon (Si) or Al—Si-copper (Cu).

A three-layer structure including a titanium nitride (TiN) layer 21, a titanium oxynitride (TiON) layer 22, and a titanium oxide (TiO) layer 23 deposited on the TiON layer 22 is provided on the top surface of the high-potential-side wiring layer 11. The TiN layer 21 has a thickness of about 30 nanometers or greater and 40 nanometers or less, for example. The TiON layer 22 has a thickness of about 30 nanometers or greater and 40 nanometers or less, for example. The TiO layer 23 has a thickness of about 30 nanometers or greater and 40 nanometers or less, for example.

The TiN layer 21 serves as an anti-reflection film for preventing reflection (halation) of light from the metal film as a base of the high-potential-side wiring layer 11 during the formation of a resist pattern for delineating the metal film. The TiON layer 22 is formed such that oxygen (O) and nitrogen (N) are diffused into a Ti layer provided on the TiN layer 21 to serve as an anti-reflection film together with the TiN layer 21. The TiO layer 23 is formed by the oxidation of the top surface of the Ti layer provided on the TiN layer 21 to serve as the anti-reflection film together with the TiN layer 21.

The surface passivation film (31, 32) is deposited on the top surface of the TiO layer 23. The surface passivation film (31, 32) includes a first insulating film 31 deposited on the TiO layer 23, and a second insulating film 32 deposited on the first insulating film 31. The first insulating film 31 is a silicon oxide film (a $SiO_2$ film) having a thickness of about 200 nanometers, for example. The first insulating film 31 may be an insulating film (a TEOS film) deposited by chemical vapor deposition (CVD) using tetraethoxysilane (TEOS) gas of an organic silicon compound. The second insulating film 32 is a silicon nitride film (a $Si_3N_4$ film) having a thickness of about 500 nanometers or greater and 1000 nanometers or less, for example.

The number and the material of the layers included in the surface passivation film (31, 32) can be determined as appropriate. For example, the surface passivation film (31, 32) may be a single film, or may include three or more layers laminated together. The surface passivation film (31, 32) may have a structure including at least one of a polyimide film, a silicon oxide film (a $SiO_2$ film) without containing phosphorus (P) or boron (B) which is referred to as a non-doped silicate glass (NSG) film, a phosphosilicate glass (PSG) film, a borosilicate glass (BSG) film, and a borophosphosilicate glass (BPSG) film.

The opening 11b is provided to penetrate the TiN layer 21, the TiON layer 22, the TiO layer 23, and the surface passivation film (31, 32). A part of the high-potential-side wiring layer 11 exposed on the opening 11b serves as the high-potential-side pad 11a.

The opening 11b is formed such that the TiN layer 21, the TiON layer 22, the TiO layer 23, and the surface passivation film (31, 32) are partly removed by use of a common etching mask. The edge of the second insulating film 32 is defined by side etching to be retreated from the respective edges of the TiN layer 21, the TiON layer 22, the TiO layer 23, and the first insulating film 31. The respective edges of the TiN layer 21, the TiON layer 22, the TiO layer 23, and the surface passivation film (31, 32) are exposed on the side wall of the opening 11b.

<Method of Manufacturing Semiconductor Device>

An example of a method of manufacturing the semiconductor device according to the first embodiment of the present invention is described below with reference to FIG. 4A to 5C while focusing on the cross section illustrated in FIG. 3. It should be understood that the method of manufacturing the semiconductor device described below is an example, and the semiconductor device can be manufactured by various methods other than the method described below including modified examples within the scope of the appended claims.

First, a semiconductor substrate such as a Si substrate is prepared. Several kinds of elements such as a semiconductor element and a passive element are formed on the semiconductor substrate by use of photolithography, ion implantation, dry etching, CVD, and the like, and the multi-layer wiring structure is further provided on the semiconductor substrate.

Figure 4A:
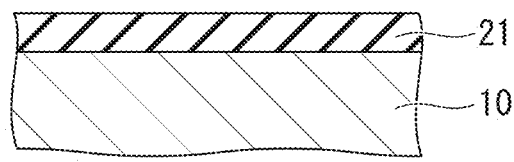
FIG. 4A is a cross-sectional process view illustrating the semiconductor device according to the first embodiment of the present invention.
Figure 4B:
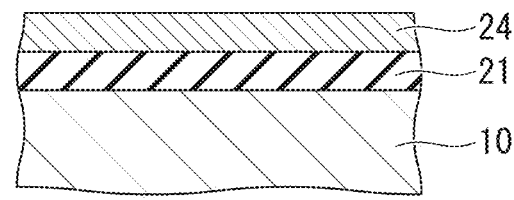
FIG. 4B is a cross-sectional process view continued from FIG. 4A illustrating the semiconductor device according to the first embodiment of the present invention.

Next, a metal film for wiring formation 10 made of metallic material such as Al or an Al alloy is deposited by sputtering or the like on the uppermost layer of the multi-layer wiring structure. As illustrated in FIG. 4A, the TiN layer 21 is then deposited on the metal film for wiring formation 10 by sputtering or the like so as to have a thickness of about 30 nanometers or greater and 40 nanometers or less. As illustrated in FIG. 4B, the Ti layer 24 is then deposited on the TiN layer 21 by sputtering or the like so as to have a thickness of about 30 nanometers or greater and 40 nanometers or less. The TiN layer 21 and the Ti layer 24 each have lower reflectance than the metal film for wiring formation 10 made of Al or an Al alloy, so as to serve as an anti-reflection film. The thickness of the Ti layer 24 may be 40 nanometers or greater.

The sequential deposition of the metal film for wiring formation 10, the TiN layer 21, and the Ti layer 24 is preferably executed through an integrated process. In particular, a wafer transfer between the respective chambers is preferably executed in a vacuum by use of a common sputtering apparatus so as to continuously deposit the metal film for wiring formation 10, the TiN layer 21, and the Ti layer 24 without returning to the atmosphere during the process. The use of the metal film for wiring formation 10 made of Al or an Al alloy leads the interface between the metal film for wiring formation 10 and the TiN layer 21 and the interface between the TiN layer 21 and the Ti layer 24 to be in a closely joined state, so as to prevent separation between the layers during the manufacturing process. Instead of the deposition through the integrated process, the metal film for wiring formation 10, the TiN layer 21, and the Ti layer 24 may be sequentially deposited by use of an independent sputtering apparatus.

If the Ti layer 24 is deposited with a thickness of less than 30 nanometers, oxygen and nitrogen may be diffused and collide with each other in the Ti layer 24 during ozone oxidation for passivating the high-potential-side wiring layer 11 or during heat treatment such as plasma CVD for forming the surface passivation film (31, 32) as described below, which results in the fragile TiON layer 22 having less film hardness to cause the separation of the TiON layer 22 due to a shear stress during the heat treatment accordingly. The Ti layer 24 is thus preferably deposited to have a thickness of 30 nanometers or greater.

Figure 4C:
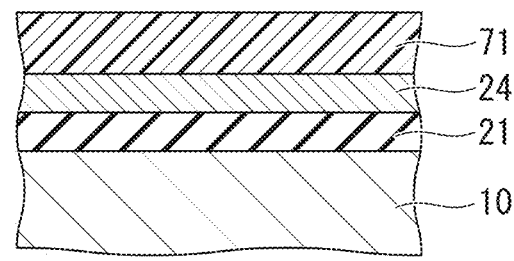
FIG. 4C is a cross-sectional process view continued from FIG. 4B illustrating the semiconductor device according to the first embodiment of the present invention.

Next, as illustrated in FIG. 4C, a photoresist film 71 is applied on the Ti layer 24. The photoresist film 71 is then delineated by photolithography. The TiN layer 21 and the Ti layer 24, which serve as the anti-reflection films, can prevent reflection (halation) of light from the metal film for wiring formation 10. Using the delineated photoresist film 71 as an etching mask, the metal film for wiring formation 10, the TiN layer 21, and the Ti layer 24 are selectively removed by dry etching such as reactive ion etching (RIE). The selective removal by dry etching delineates the metal film for wiring formation 10, the TiN layer 21, and the Ti layer 24 so as to form a wiring pattern of the high-potential-side wiring layer 11. Although not illustrated, the other wiring patterns of the high-potential-side wiring layers 12 and 13 and the low-potential-side wiring layers 14, 15, and 16 illustrated in FIG. 2 are simultaneously formed by the selective etching removal of the metal film for wiring formation 10.

While FIG. 4C illustrates the cross section of the wiring pattern focusing on the high-potential-side wiring layer 11 at a position in which the metal film for wiring formation 10, the TiN layer 21, and the Ti layer 24 remain without being removed, the same is also applied to the other wiring patterns. Namely, the TiN layer 21 and the Ti layer 24 are delineated to form the multi-layer structure also on the respective high-potential-side wiring layers 12 and 13 and the respective low-potential-side wiring layers 14, 15, and 16. An interlayer insulating film is exposed on the part in which the wiring patterns of the high-potential-side wiring layers 12 and 13 and the low-potential-side wiring layers 14, 15, and 16 are not present.

Figure 5A:
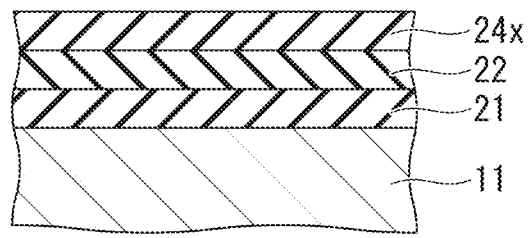
FIG. 5A is a cross-sectional process view continued from FIG. 4C illustrating the semiconductor device according to the first embodiment of the present invention.

After the photoresist film 71 is removed and the surface of the Ti layer 24 is cleaned, the passivating treatment for oxidizing the Ti layer 24 is executed by ozone oxidation or the like at a temperature of about 300° C. In this treatment, ozone is diffused from the top surface of the Ti layer 24, and a titanium oxide (TiO$_2$) layer 24x of anatase type having an amorphous structure is formed with a thickness of about 5 nanometers or greater and 10 nanometers or less, as illustrated in FIG. 5A. Since both ozone from above and nitrogen from below are diffused into the Ti layer 24, the TiON layer 22 is formed between the TiN layer 21 and the TiO$_2$ layer 24x.

Figure 5B:
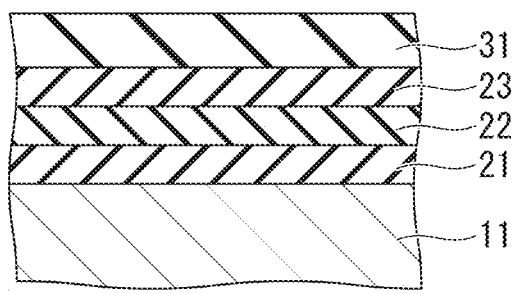
FIG. 5B is a cross-sectional process view continued from FIG. 5A illustrating the semiconductor device according to the first embodiment of the present invention.

Next, the first insulating film 31 such as a silicon oxide film is deposited on the TiO$_2$ layer 24x by a method such as plasma CVD at a temperature of about 380° C. or higher and 405° C. or lower at a normal pressure. The first insulating film 31 is also deposited on the multi-layer wiring structure exposed on the part in which the wiring patterns of the high-potential-side wiring layers 11, 12 and 13 and the low-potential-side wiring layers 14, 15, and 16 are not present. The interposition of the TiON layer 22 between the TiN layer 21 and the TiO$_2$ layer 24x during the deposition of the first insulating film 31 promotes the downward diffusion of oxygen contained in the TiO$_2$ layer 24x to decrease the oxygen concentration in the TiO$_2$ layer 24x, so as to form the hydrophilic TiO layer 23, as illustrated in FIG. 5B. A spin-on-glass (SOG) film may be applied on the first insulating film 31 after the deposition of the first insulating film 31, and then cured at a temperature of about 400° C. or higher and 450° C. or lower.

Figure 5C:
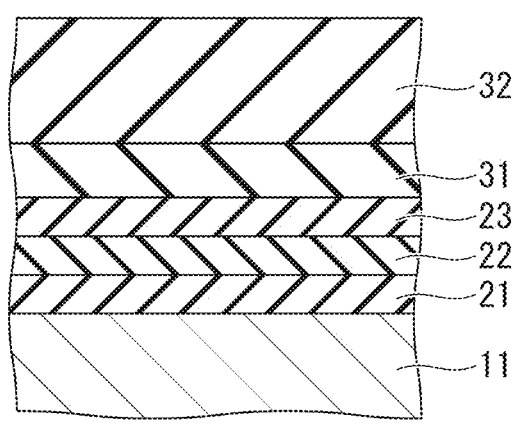
FIG. 5C is a cross-sectional process view continued from FIG. 5B illustrating the semiconductor device according to the first embodiment of the present invention.

Next, hydrogen annealing is executed at a temperature of about 400° C. for about 30 minutes. The second insulating film 32 such as a silicon nitride film is then deposited on the first insulating film 31 by a method such as plasma CVD at a temperature of about 400° C. with about −390 MPa, as illustrated in FIG. 5C. The second insulating film 32 is also deposited on the first insulating film 31 deposited on the part in which the wiring patterns of the high-potential-side wiring layers 11, 12 and 13 and the low-potential-side wiring layers 14, 15, and 16 are not present.

Next, a mask film (not illustrated) such as a silicon nitride film is deposited on the second insulating film 32 by a method such as plasma CVD, and the mask film is delineated by photolithography and etching. Using the delineated mask film as an etching mask for pad opening, the second insulating film 32, the first insulating film 31, the TiO layer 23, the TiON layer 22, and the TiN layer 21 are sequentially selectively removed by dry etching such as RIE. The opening 11b is thus formed to expose a part of the high-potential-side wiring layer 11 so as to use the part exposed on the opening 11b to serve as the high-potential-side pad 11a, as illustrated in FIG. 3. The respective edges of the second insulating film 32, the first insulating film 31, the TiO layer 23, the TiON layer 22, and the TiN layer 21 are exposed on the side wall of the opening 11b. The execution of the dry etching also causes the other high-potential-side wiring layers 12 and 13 and the low-potential-side wiring layers 14, 15, and 16 to be partly exposed, so as to provide the respective high-potential-side pads 12a and 13a and the respective low-potential-side pads 14a, 15a, and 16a at the exposed parts.

Comparative Example

A semiconductor device of a comparative example is described below. The semiconductor device of the comparative example differs from the semiconductor device according to the first embodiment of the present invention in having a two-layer structure including the TiN layer 21 and a high-concentration TiO layer 25 on the high-potential-side wiring layer 11, as partly illustrated in FIG. 6, while the semiconductor device according to the first embodiment has the three-layer structure including the TiN layer 21, the TiON layer 22, and the TiO layer 23 on the high-potential-side wiring layer 11, as partly illustrated in FIG. 3.

In particular, as partly illustrated in FIG. 4B, the manufacturing process for the semiconductor device according to the first embodiment of the present invention provides the two-layer structure including the TiN layer 21 and the Ti layer 24 each serving as an anti-reflection film on the high-potential-side wiring layer 11 to obtain the three-layer structure including the TiN layer 21, the TiON layer 22, and the TiO layer 23 accordingly, as illustrated in FIG. 3. The manufacturing process for the semiconductor device of the comparative example provides the single TiN layer 21 serving as an anti-reflection film without forming the Ti layer 24 to obtain the two-layer structure including the TiN layer 21 and the high-concentration TiO layer 25, as illustrated in FIG. 6.

Figure 6:
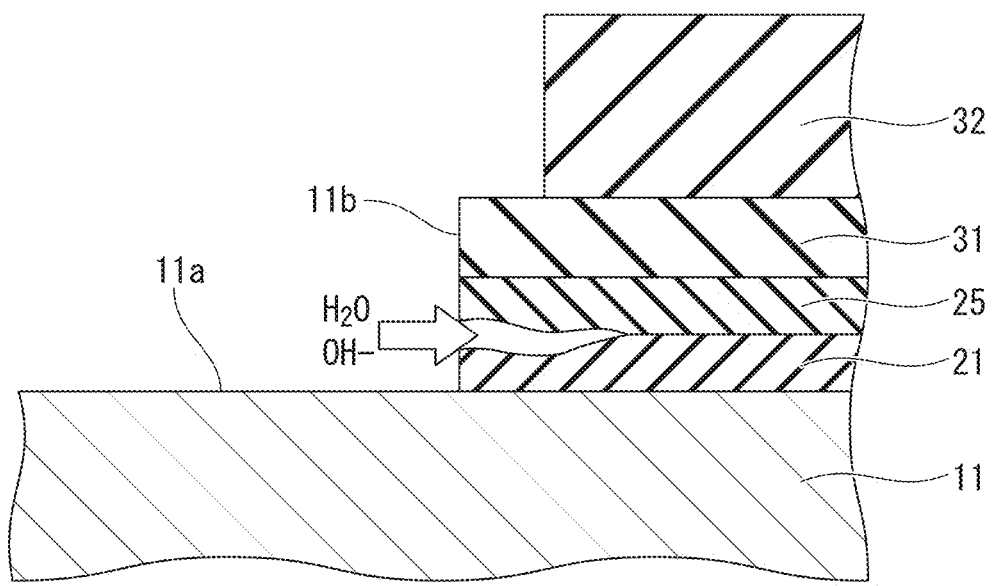
FIG. 6 is a cross-sectional view illustrating a main part of a semiconductor device of a comparative example with respect to the first embodiment of the present invention.

In the semiconductor device of the comparative example illustrated in FIG. 6, the edge of the high-concentration TiO layer 25 is exposed on the side wall of the opening 11b. The high-concentration TiO layer 25 has oxygen concentration and superhydrophilicity higher than those of the TiO layer 23. This leads moisture or OH$^-$ to easily enter the interface between the TiN layer 21 and the high-concentration TiO layer 25 under the temperature-humidity-bias (THB) environment, and tends to cause separation between the TiN layer 21 and the high-concentration TiO layer 25 due to a decomposition reaction. In addition, the reaction between TiN and moisture produces TiO to lead to volume expansion to cause cracks or voids in the surface passivation film (31, 32), resulting in a decomposition reaction at the circumference of the high-potential-side pad 11a or faults such as corrosion of the wiring layer.

Figure 7:
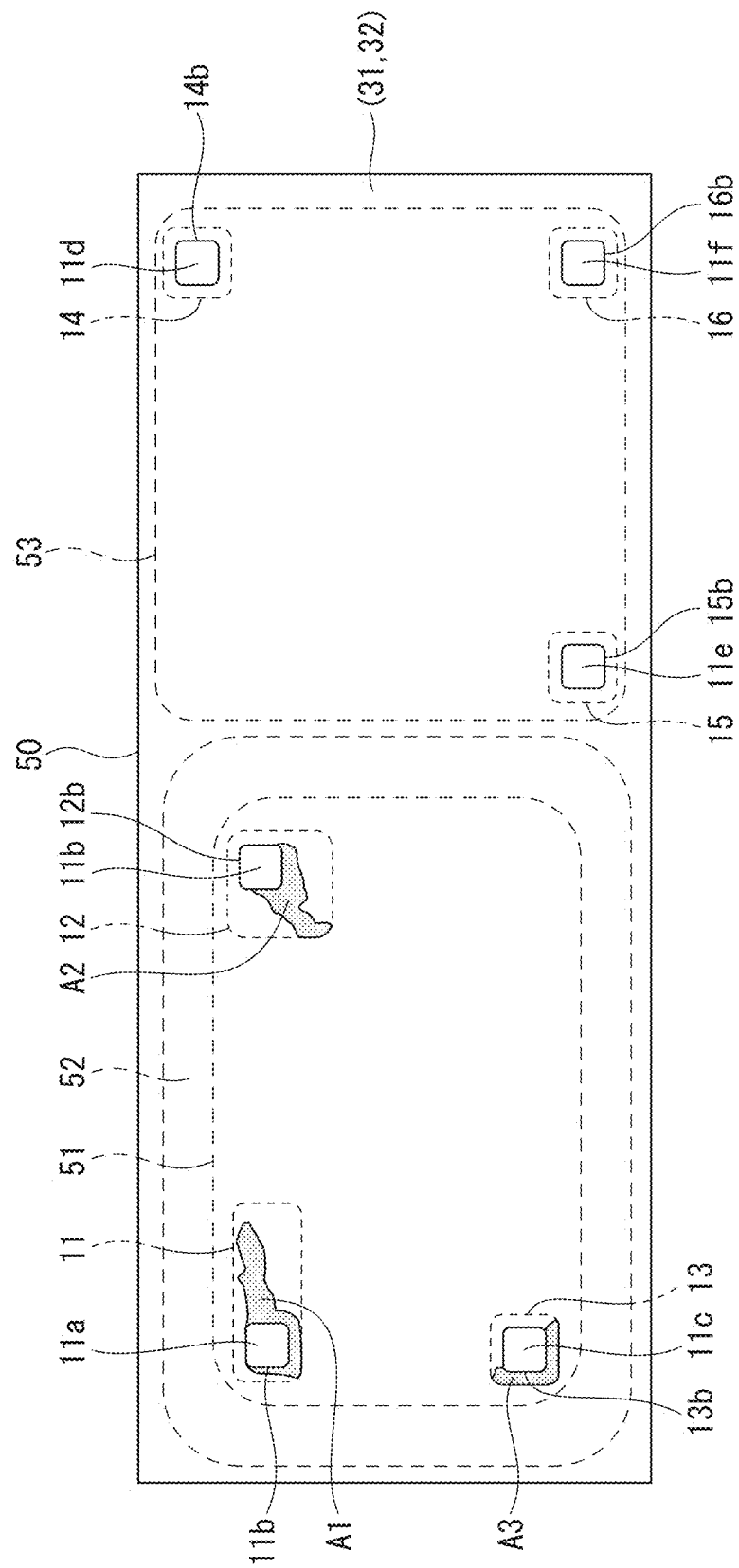
FIG. 7 is a schematic plan view illustrating the semiconductor device of the comparative example with respect to the first embodiment of the present invention.

If the semiconductor device of the comparative example is used for a HVIC, the separation tends to be caused at the circumference of the respective high-potential-side pads 11a, 12a, and 13a due to an anodic oxidation reaction (a decomposition reaction), as illustrated in FIG. 7. FIG. 7 schematically illustrates areas A1, A2, and A3 in which the separation is caused between the TiN layer 21 and the high-concentration TiO layer 25. When a temperature-humidity-bias (THB) test is executed for the semiconductor chip such as the HVIC in which a high voltage of several hundreds of volts is applied to the respective high-potential-side pads 11a, 12a, and 13a, a large amount of impurity ions or OH⁻ contained in molded resin is accumulated toward the high-potential-side pads 11a, 12a, and 13a. Further, since the high-concentration TiO layer 25 has superhydrophilicity, TiO reacts with moisture or OH⁻ accumulated around the high-potential-side pads 11a, 12a, and 13a under the THB environment, and nitrogen is released as ammonium ions ($NH_4^+$) from the TiN layer 21 having hydrophobicity. The inventors found out that a precipitate such as $Ti(OH)_4$ is deposited at the released part, and the volume expansion of TiO promotes at the interface with the TiN layer 21, causing voids at the interface or cracks in the surface passivation film to result in faults in shape of the pads.

In the semiconductor device according to the first embodiment of the present invention, while the respective edges of the TiN layer 21, the TiON layer 22, the TiO layer 23, and the surface passivation film (31, 32) are exposed on the side wall of the opening 11b as illustrated in FIG. 3, the TiON layer 22 interposed as a buffer layer between the hydrophobic TiN layer 21 and the hydrophilic TiO layer 23 promotes the downward diffusion of oxygen. This decreases the oxygen concentration in the TiO layer 23 to shift from superhydrophilicity to hydrophilicity, so as to avoid rapid introduction of moisture or OH⁻ from the side wall of the opening 11b to prevent the reaction of moisture or OH⁻ with TiN (the anodic oxidation reaction). In addition, the bond of hydrogen between the TiO layer 23 and the TiON layer 22 can prevent the entrance of moisture. The prevention of the entrance of moisture can reduce the volume expansion of TiO or the releasing phenomenon of $NH_4^+$ from TiN accordingly.

Figure 8:
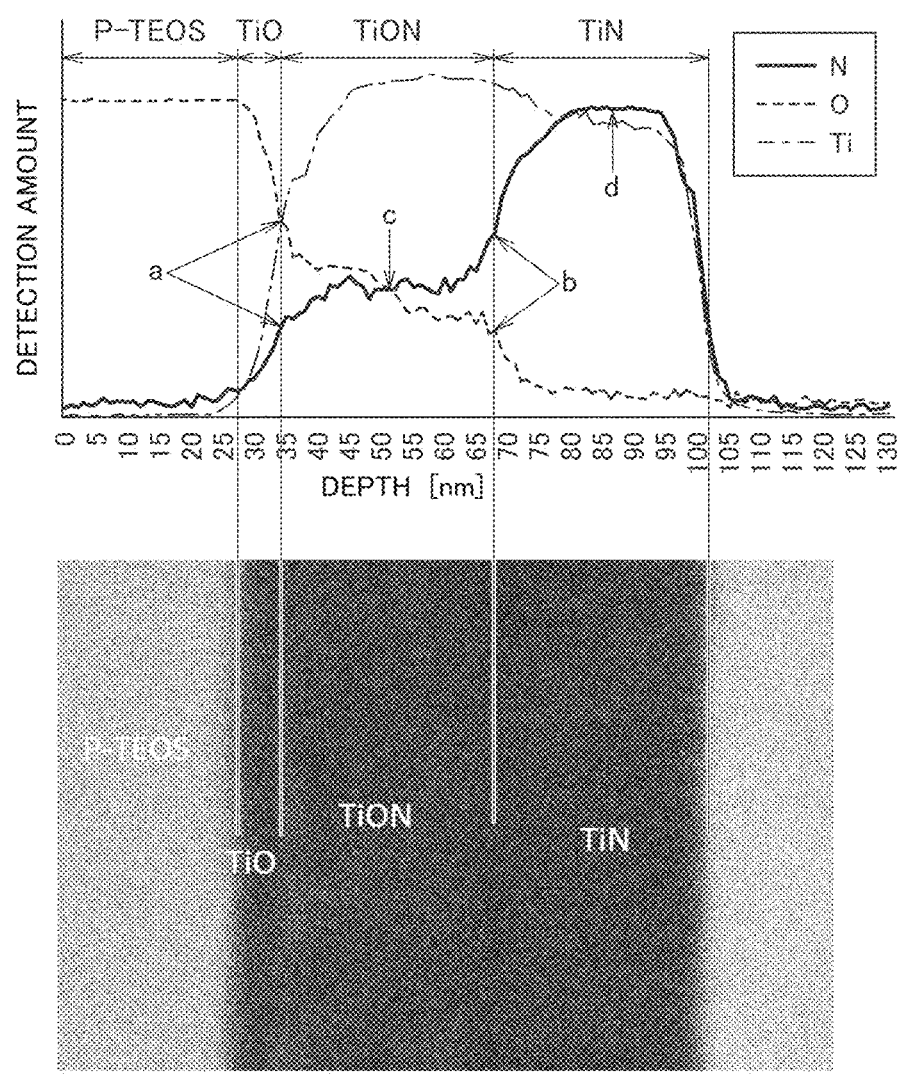
FIG. 8 is a view showing a line profile by a scanning transmission electron microscope (STEM) in a case in which a Ti film has a thickness of 35 nanometers on an upper side, and a micrograph by the STEM corresponding to the upper side of FIG. 8 on a lower side.
Figure 9:
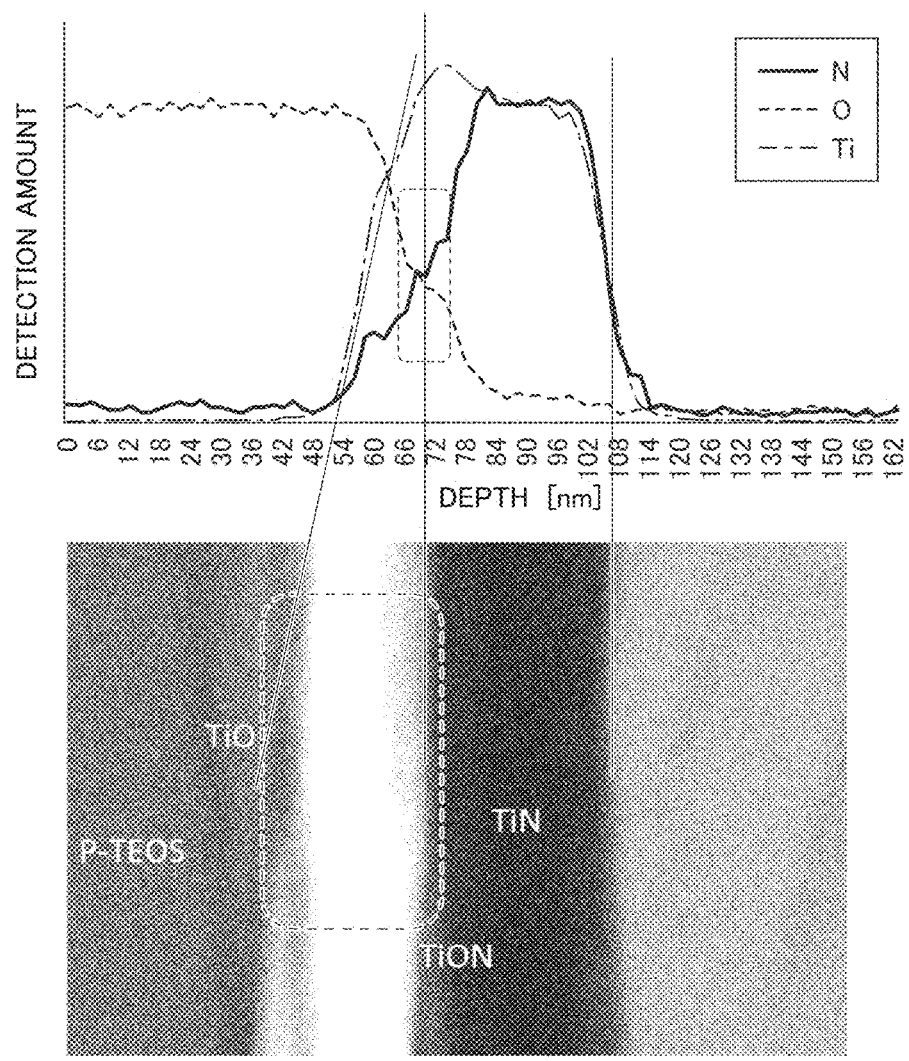
FIG. 9 is a view showing a line profile by the STEM in a case in which the Ti film has a thickness of 15 nanometers on an upper side, and a micrograph by the STEM corresponding to the upper side of FIG. 9 on a lower side.
Figure 10:
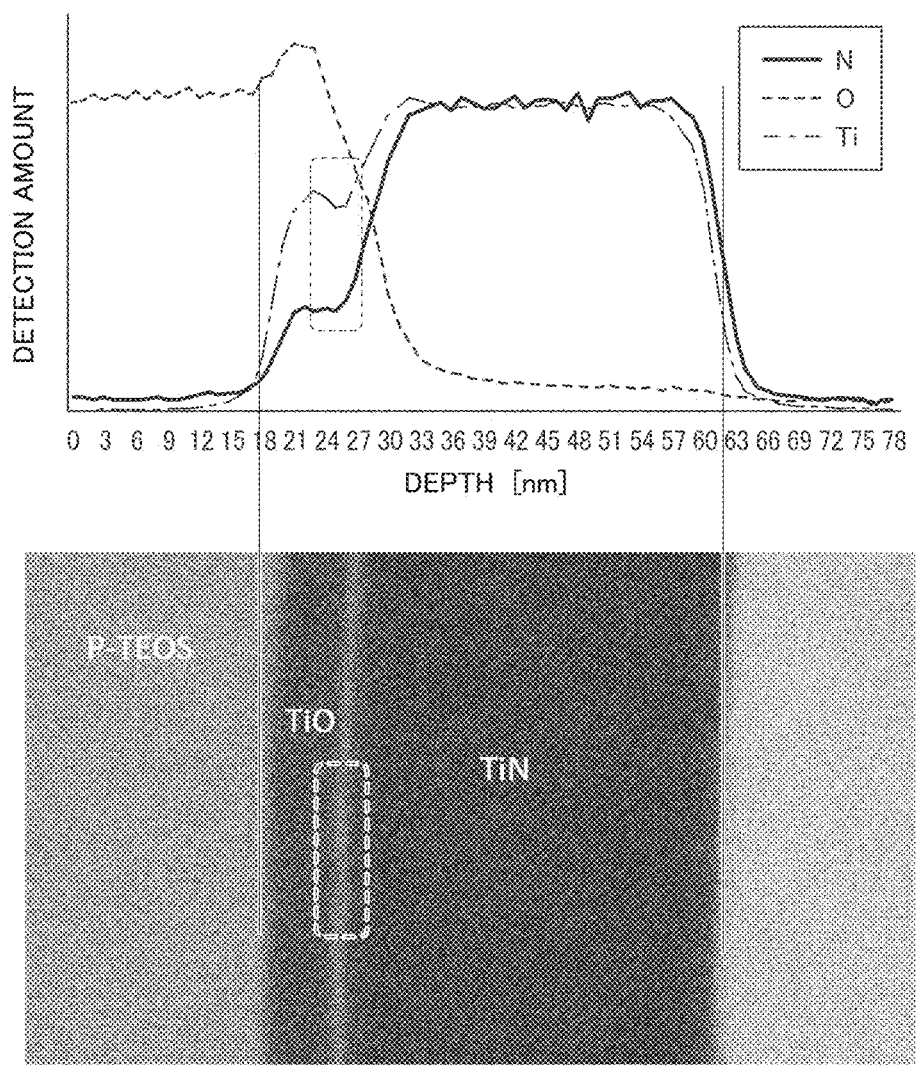
FIG. 10 is a view showing a line profile by the STEM in a case in which the Ti film has a thickness of 5 nanometers on an upper side, and a micrograph by the STEM corresponding to the upper side of FIG. 10 on a lower side.

FIG. 8, FIG. 9, and FIG. 10 show, on an upper side, line profiles by a STEM in a case in which the Ti layer deposited on the TiN layer in the manufacturing process has a thickness of each of 35, 15, and 5 nanometers. FIG. 8, FIG. 9, and FIG. 10 shows, on a lower side, micrographs by the STEM corresponding to the upper side of FIG. 8, FIG. 9, and FIG. 10. The line profiles and the micrographs by the STEM are obtained from samples after the completion of the entire manufacturing process including the passivation film step.

In the line profiles of FIG. 8, FIG. 9, and FIG. 10, the detection amount of the respective elements is treated such that the 0 element in the TEOS (P-TEOS) layer formed by plasma CVD and the Ti element and the N element in the TiN layer have peak detection intensity substantially equal to each other. The boundary between the TiO layer 21 and the TiON layer 22 and the boundary between the TiON layer 22 and the TiO layer 23 can be generally defined as follows.

As illustrated in the line profile of FIG. 8, the boundary between the TiO layer 21 and the TiON layer 22 is defined along a position "a" in which the respective concentration inclinations of oxygen and nitrogen are shifted from a steep state to a gentle state in the depth direction from the surface passivation film 31. The boundary between the TiON layer 22 and the TiO layer 23 is defined along a position "b" in which the respective concentration inclinations of oxygen and nitrogen are shifted to the steep state in the depth direction from the position "a". The nitrogen concentration in the TiON layer 22 at a position "c" at which the oxygen concentration and the nitrogen concentration intersect with each other is preferably half or lower of the concentration at a position "d" at which the TiN layer 21 has the highest nitrogen concentration.

As shown in the upper side of FIG. 8, when the thickness of the Ti layer deposited on the TiN layer is 30 nanometers or greater, the regions in which the respective concentration inclinations of oxygen and nitrogen in the Ti layer are steep do not intersect with each other, so as to avoid the separation at the film interface during the manufacturing process. The separation at the respective interfaces between the TiN, TiON, and TiO is thus not observed in the micrograph of FIG. 8. In contrast, when the thickness of the Ti layer deposited on the TiN layer is less than 30 nanometers, as shown in the micrographs of FIG. 9 and FIG. 10, the regions in which the respective concentration inclinations of oxygen and nitrogen diffused into the Ti layer are steep intersect with each other, as indicated in the region surrounded by the broken line. This provides the fragile TiON layer, which may induce film separation due to a shear stress during high-temperature treatment. The separation is observed in each of the micrographs of FIG. 9 and FIG. 10 as indicated by the white part in the region surrounded by the broken line.

The Ti layer 24 is thus preferably deposited to have a thickness of 30 nanometers or greater as an anti-reflection film on the TiN layer 21 in the manufacturing process for the semiconductor device. The end product of the semiconductor device preferably has 30 nanometers or greater of the total thickness of the TiON layer 22 and the TiO layer 23 corresponding to the thickness of the Ti layer 24. Setting the thickness of the Ti layer 24 to 30 nanometers or greater can lead the nitrogen concentration in the TiON layer 22 at the part at which the oxygen concentration and the nitrogen concentration intersect with each other to be half or lower of the concentration at the part at which the TiN layer 21 has the highest nitrogen concentration.

As described above, the manufacturing process for the semiconductor device according to the first embodiment of the present invention provides the two-layer structure including the TiN layer 21 as a lower layer and the Ti layer 24 as an upper layer to serve as the anti-reflection films on the metal film for wiring formation 10, so as to reduce the reflection (halation) of light from the metal film for wiring formation 10 when forming the photoresist pattern for delineating the respective high-potential-side wiring layers 11, 12, and 13.

The end product of the semiconductor device has the three-layer structure including the TiN layer 21, the TiON layer 22, and the TiO layer 23 on the respective high-potential-side wiring layers 11, 12, and 13. The TiON layer 22 prevents the reaction with moisture or OH⁻ or the release of $NH_4^+$ under the temperature-humidity-bias environment, so as to avoid volume expansion of the TiO layer 23. This eliminates the execution of separated operations for the etching step of etching the TiN layer 21, the TiON layer 22, and the TiO layer 23 serving as the anti-reflection films and the etching step of etching the surface passivation film 32 to cover the edge of the TiN layer 21 with the surface passivation film, so as to avoid an increase in the number of the steps of the process.

Figure 11:
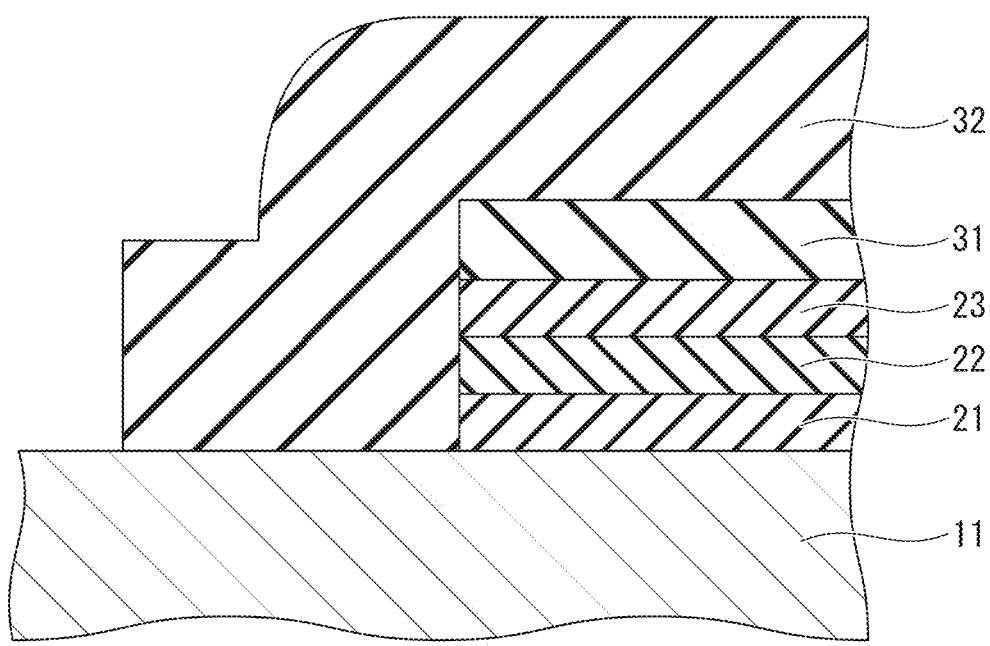
FIG. 11 is a cross-sectional view illustrating a main part of the semiconductor device according to the first embodiment of the present invention.

As illustrated in FIG. 11, the surface passivation film 32 may be formed to cover the opening 11b of the TiN layer 21, the TiON layer 22, and the TiO layer 23. While the number of the steps of the process increases in this case, the effect of preventing the volume expansion of the TiO layer 23 can be improved.

Second Embodiment

<Configuration of Semiconductor Device>

Figure 12:
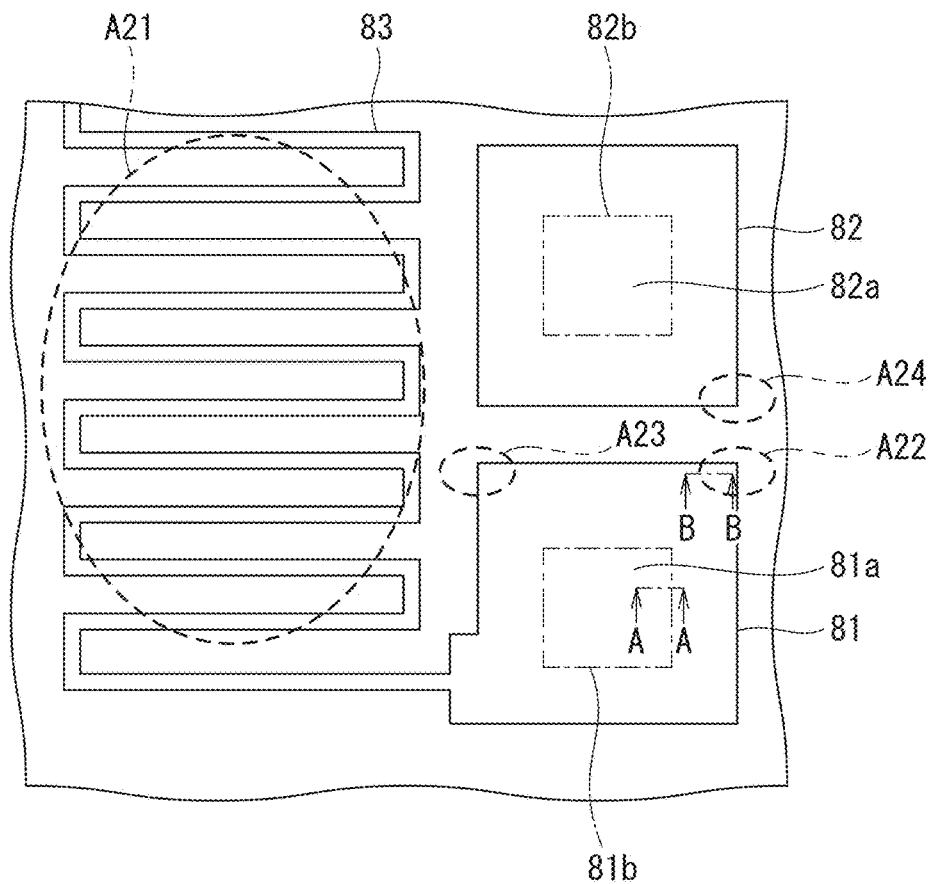
FIG. 12 is a plan view illustrating a main part of a semiconductor device of a comparative example with respect to a second embodiment of the present invention.

A semiconductor device according to a second embodiment of the present invention is illustrated below with a HVIC, as in the case of the semiconductor device according to the first embodiment of the present invention. The semiconductor device according to the second embodiment of the present invention includes wiring layers (high-potential-side wiring layers) 81, 82, and 83 at the uppermost layer of the multi-layer wiring structure on the semiconductor substrate, as illustrated in FIG. 12. The high-potential-side wiring layers 81 and 82 partly serve as pads (high-potential-side pads) 81a and 82a. The high-potential-side pads 81a and 82a are defined by openings 81b and 82b of a surface passivation film (not illustrated). FIG. 12 illustrates the openings 81b and 82b of the surface passivation film as indicated by the dash-dotted lines. The high-potential-side wiring layer 83 has a meandering wiring pattern.

Figure 13:
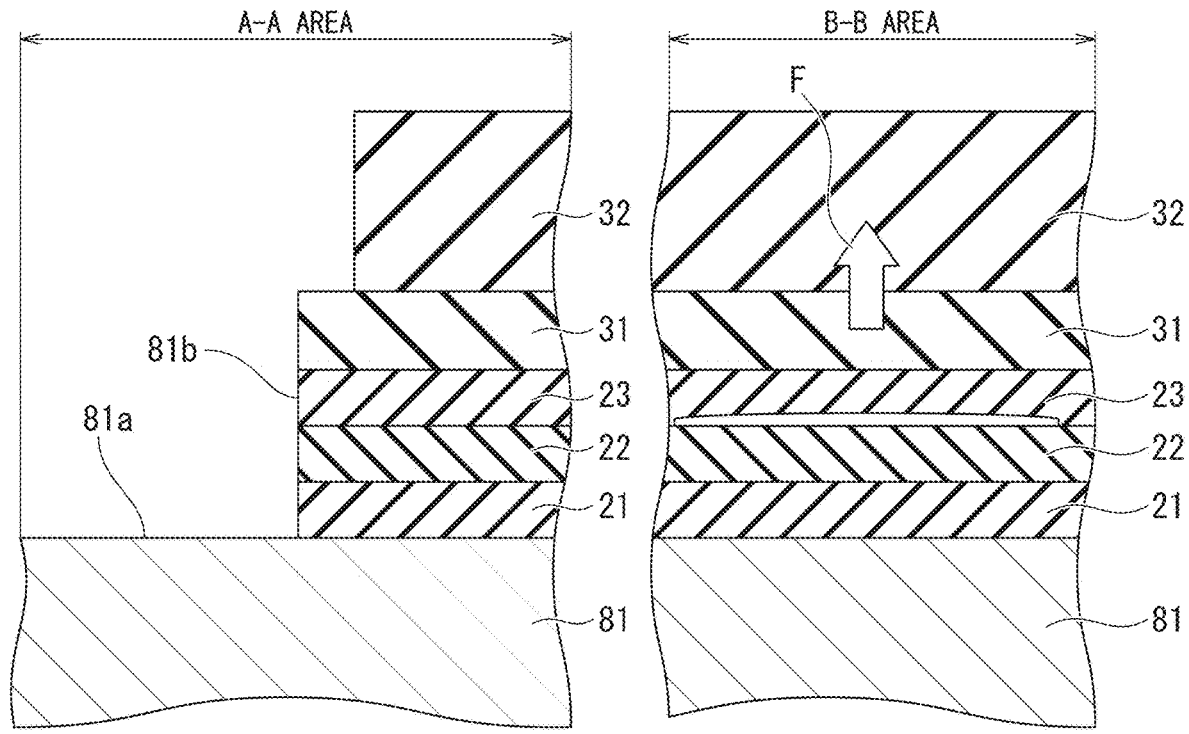
FIG. 13 is a view illustrating cross sections taken along line A-A and along line B-B in FIG. 12.

FIG. 13 is a view, separately indicated on the right and left sides, illustrating a cross section at the circumferential area of the high-potential-side pad 81a as viewed in direction A-A in FIG. 12 and a cross section adjacent to the edge of the high-potential-side wiring layer 81 as viewed in direction B-B distant from the circumferential area of the high-potential-side pad 81a. As illustrated in FIG. 13, if the three-layer structure including the TiN layer 21, the TiON layer 22, and the TiO layer 23 on the high-potential-side wiring layer 81 is provided entirely in the semiconductor device, separation may be caused at the interface between the TiON layer 22 and the TiO layer 23 due to curing of the SOG film or heat treatment such as hydrogen annealing, since the adhesion at the interface between the TiON layer 22 and the TiO layer 23 is low. As shown on the right side in FIG. 13, a tensile stress F of the surface passivation film (31, 32) after the deposition of the second insulating film 32 may promote the separation at the interface between the TiON layer 22 and the TiO layer 23 to result in degradation of external appearance. The interface separation occurs particularly when the thickness of the Ti layer 24 on the TiN layer is 30 nanometers or less during the manufacturing process.

The separation at the interface between the TiON layer 22 and the TiO layer 23 tends to promote particularly in an area A21 in the wiring pattern of the high-potential-side wiring layer 83 and in areas A22, A23, and A24 adjacent to the edges (the corners) of the high-potential-side wiring layers 81 and 82 serving as the high-potential-side pads 81a and 82, due to a film stress at the respective edges of the high-potential-side wiring layers 81, 82, and 83, as illustrated in FIG. 12.

Figure 14:
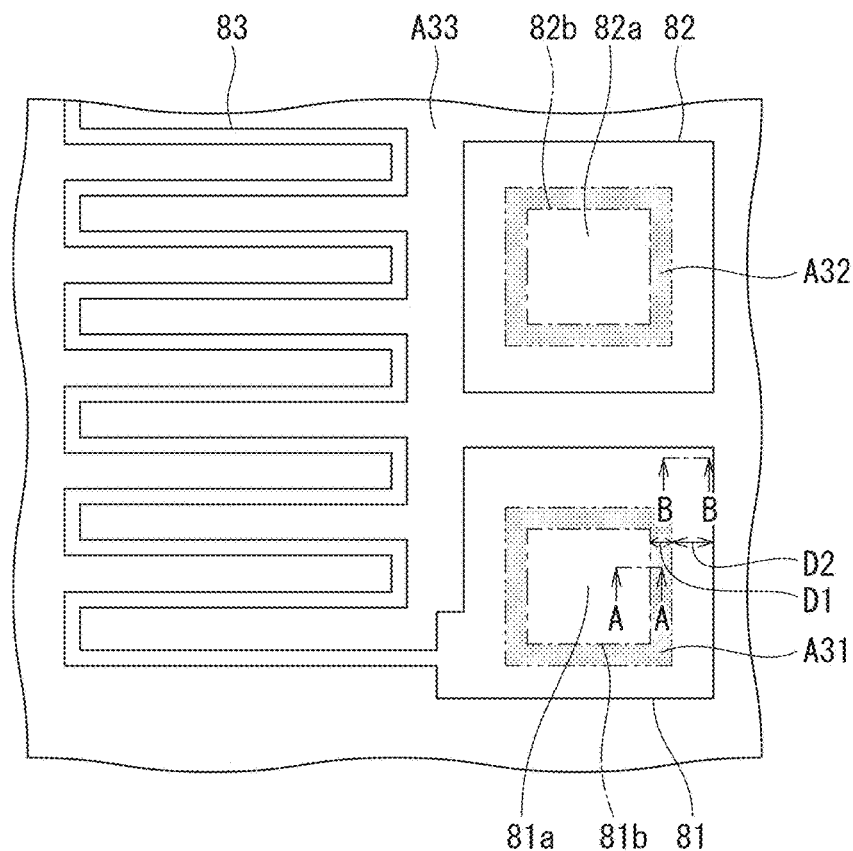
FIG. 14 is a plan view illustrating a main part of a semiconductor device according to the second embodiment of the present invention.

To deal with this problem, as illustrated in FIG. 14, the semiconductor device according to the second embodiment of the present invention uses the anti-reflection film having a structure that differs between circumferential areas (pad circumferential areas) A31 and A32 of the high-potential-side pads 81a and 82a and an area (a pad separation area) A33 separated further from the high-potential-side pads 81a and 82a than the pad circumferential areas A31 and A32. FIG. 14 illustrates the pad circumferential areas A31 and A32 each indicated by the gray hatch and the pad separation area A33 with no hatch. The pad separation area A33 is the other area excluding the pad circumferential areas A31 and A32, and includes the edges of the high-potential-side wiring layers 81 and 82 serving as the high-potential-side pads 81a and 82a and the high-potential-side wiring layer 83 having the wiring pattern.

The pad circumferential areas A31 and A32 each have a frame-shaped planar pattern surrounding the high-potential-side pads 81a and 82a. The respective pad circumferential areas A31 and A32 are defined in an area with a predetermined distance D1 from the respective openings 81b and 82b. The respective pad circumferential areas A31 and A32 are also defined to be distant from the edges of the respective high-potential-side wiring layers 81 and 82 by a predetermined distance D2. In other words, the pad separation area A33 is defined to include the predetermined distance D2 from the edges of the respective high-potential-side wiring layers 81 and 82. The distance D1 is about one micrometer or greater, and preferably five micrometers or greater, for example. The distance D2 is about 10 micrometers or greater, for example.

Figure 15:
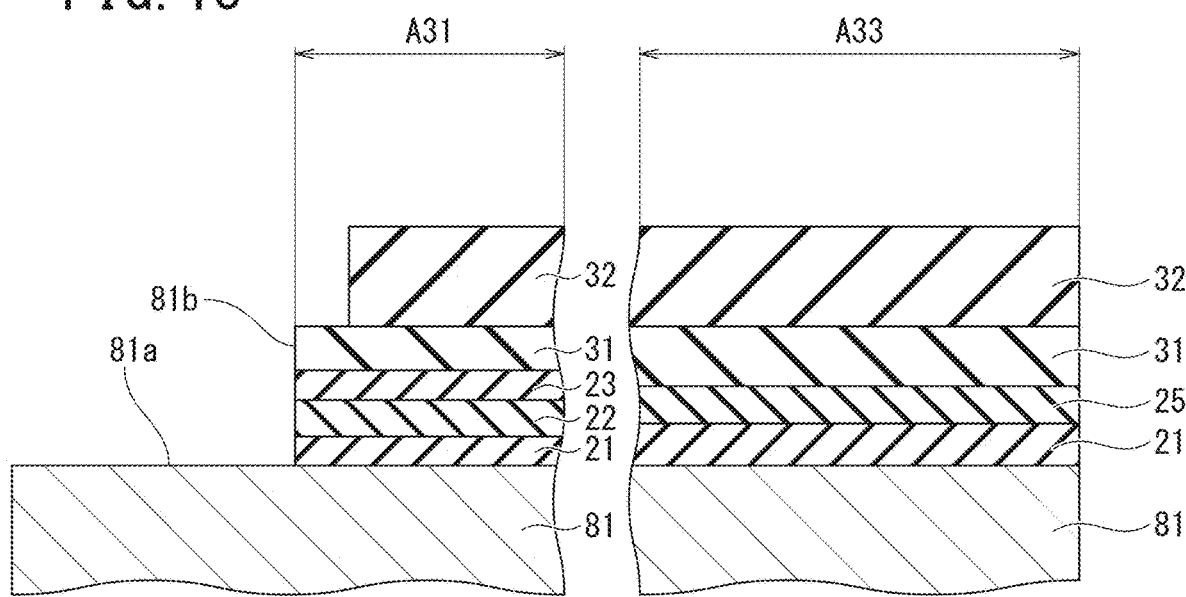
FIG. 15 is a view illustrating cross sections taken along line A-A and along line B-B in FIG. 14.

FIG. 15 is a view, separately indicated on the right and left sides, illustrating a cross section of the pad circumferential area A31 as viewed in direction A-A in FIG. 14 and a cross section of the pad separation area A33 as viewed in direction B-B in FIG. 14. The pad circumferential area A31 indicated on the left side in FIG. 15 selectively (locally) has a three-layer structure of the TiN layer 21, the TiON layer 22, and the TiO layer 23 on the high-potential-side wiring layer 81. The TiON layer 22 promotes the downward diffusion of oxygen, so as to decrease the oxygen concentration in the TiO layer 23 and lead the TiO layer 23 to have hydrophilicity. This can avoid a rapid moisture absorption action to prevent the entrance of moisture or OH⁻ in the pad circumferential area A31, and can prevent a decomposition reaction at the circumference of the high-potential-side pad 81a upon high-voltage application or corrosion of the wiring layer. The pad circumferential area A32 illustrated in FIG. 14 has the same structure as the pad circumferential area A31. The three-layer structure is preferably provided adjacent to the opening 11b.

The pad separation area A33 indicated on the right side in FIG. 15 has a two-layer structure of the TiN layer 21 and the high-concentration TiO layer 25 on the high-potential-side wiring layer 81. The TiON layer is not interposed between the TiN layer 21 and the high-concentration TiO layer 25 so as eliminate the interface between the TiO and TiON that has low adhesion and is easy to separate. This structure can avoid the separation and the degradation of external appearance. In addition, since the pad separation area A33 is distant from the high-potential-side pads 81a and 82a, the entrance of moisture or OH⁻ from the side walls of the high-potential-side pads 81a and 82a does not occur. Although not illustrated, the TiN layer 21 and the high-concentration TiO layer 25 are provided on the multi-layer wiring structure under the high-potential-side wiring layers 81, 82, and 83 at the part of the pad separation area A33 illustrated in FIG. 14 in which the high-potential-side wiring layers 81, 82, and 83 are not provided.

<Method of Manufacturing Semiconductor Device>

Figure 16A:
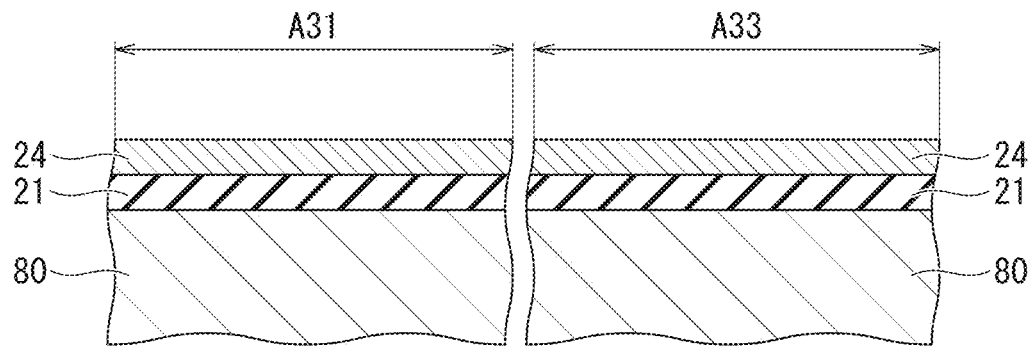
FIG. 16A is a cross-sectional process view illustrating the semiconductor device according to the second embodiment of the present invention.

An example of a method of manufacturing the semiconductor device according to the second embodiment of the present invention is described below while focusing on the cross section corresponding to the case in FIG. 15. As illustrated in FIG. 16A, the TiN layer 21 and the Ti layer 24 are sequentially deposited on a metal film for wiring formation 80, as in the case of the process in the method of manufacturing the semiconductor device according to the first embodiment of the present invention.

Figure 16B:
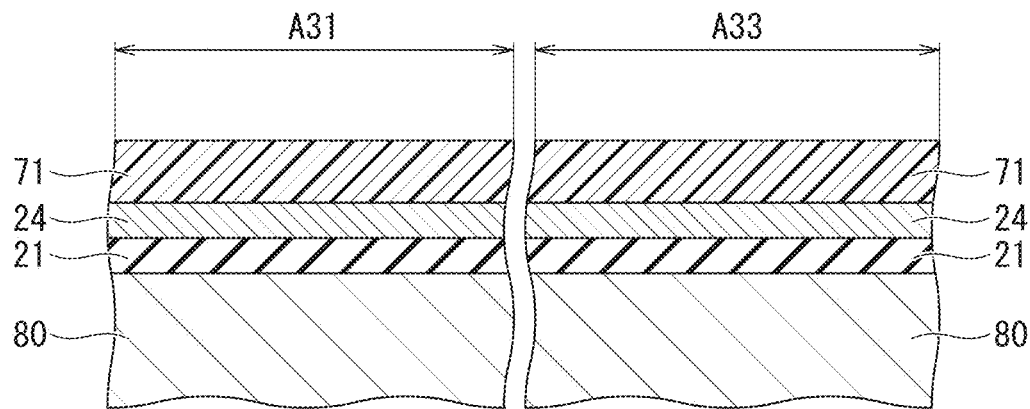
FIG. 16B is a cross-sectional process view continued from FIG. 16A illustrating the semiconductor device according to the second embodiment of the present invention.

Next, as illustrated in FIG. 16B, a photoresist film 71 is applied on the Ti layer 24. The photoresist film 71 is then delineated by photolithography. The TiN layer 21 and the Ti layer 24, which serve as the anti-reflection films, can prevent reflection (halation) of light from the metal film for wiring formation 80. Using the delineated photoresist film 71 as an etching mask, the metal film for wiring formation 80, the TiN layer 21, and the Ti layer 24 are selectively removed by dry etching such as reactive ion etching (RIE) so as to delineate the metal film for wiring formation 80, the TiN layer 21, and the Ti layer 24. FIG. 16B illustrates the part in which the metal film for wiring formation 80, the TiN layer 21, and the Ti layer 24 remain without being removed.

Figure 16C:
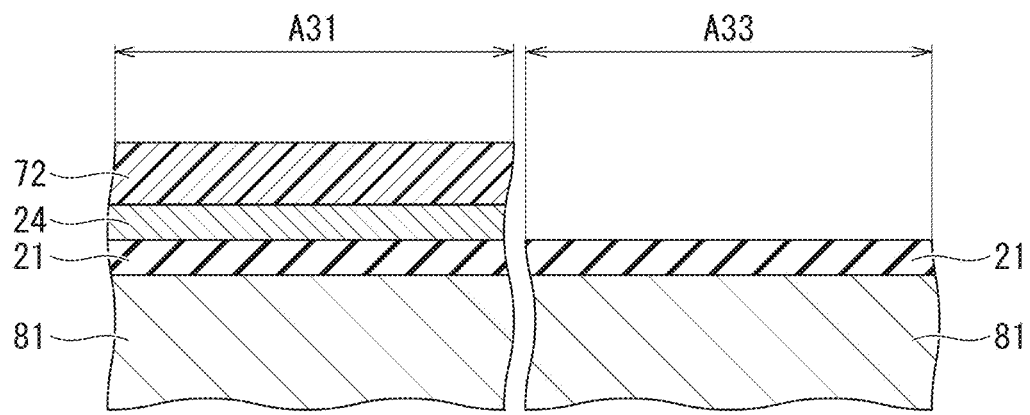
FIG. 16C is a cross-sectional process view continued from FIG. 16B illustrating the semiconductor device according to the second embodiment of the present invention.

Next, a photoresist film 72 is applied on the Ti layer 24. The photoresist film 72 is then delineated by photolithography. Using the delineated photoresist film 72 as an etching mask, the Ti layer 24 in the pad separation area A33 is selectively removed by dry etching such as RIE so as to leave the Ti layer 24 only in the pad circumferential area A31, as illustrated in FIG. 16C. The other subsequent steps in the method of manufacturing the semiconductor device according to the second embodiment of the present invention are the same as those in the method of manufacturing the semiconductor device according to the first embodiment of the present invention, and overlapping explanations are not repeated below.

Figure 17:
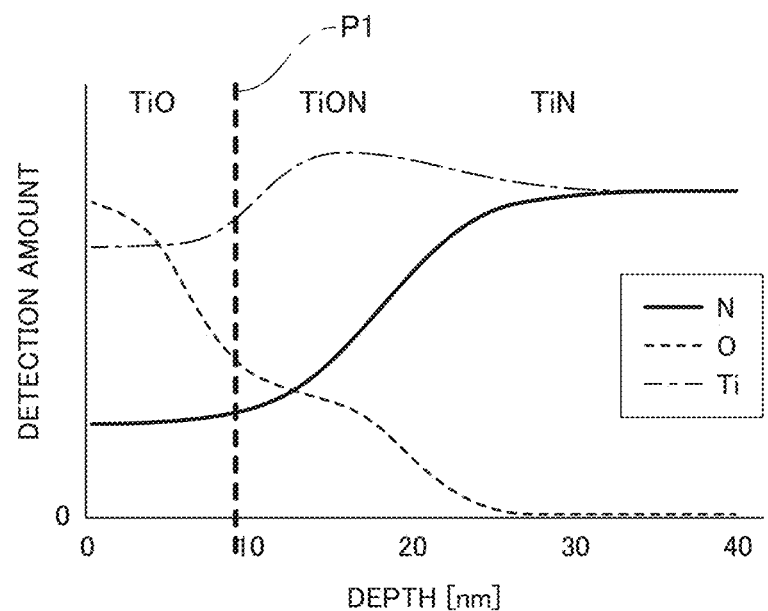
FIG. 17 is a view showing a line profile by a STEM in a case in which a TiN layer and a Ti layer are used to serve as anti-reflection films in a pad separation area.
Figure 18:
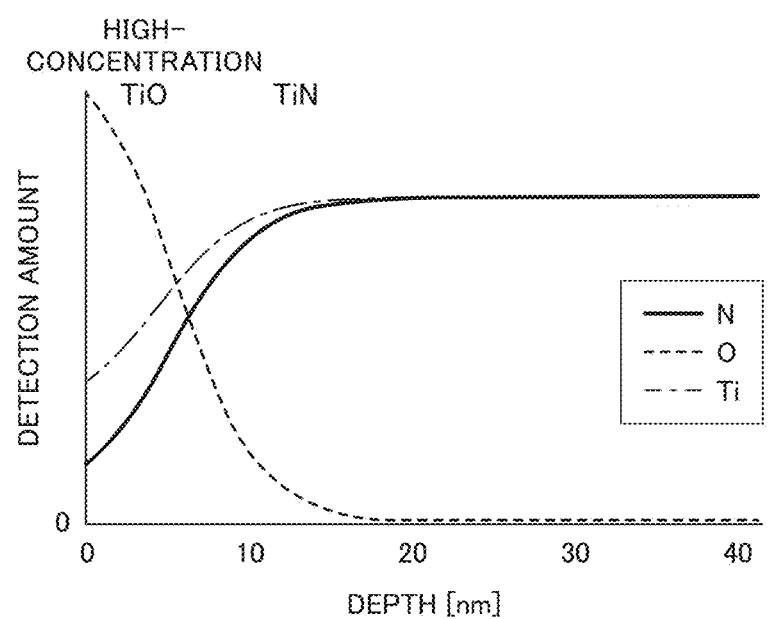
FIG. 18 is a view showing a line profile by the STEM in a case in which the single TiN layer is used to serve an anti-reflection film in the pad separation area.

FIG. 17 and FIG. 18 are views showing line profiles by a STEM in a case in which the TiN layer and the Ti layer are stacked as an anti-reflection film in the pad separation area A33 (comparative example), and a case in which only the TiN layer is stacked as an anti-reflection film in the pad separation area A33 (example). In the comparative example shown in FIG. 17, separation was observed at a position P1 indicated by the broken line around the boundary between TiO and TiON. In the example shown in FIG. 18, a steep change in the concentration inclination around the boundary between TiO and TiON was not confirmed, or a separation was not observed.

As described above, the manufacturing process for the semiconductor device according to the second embodiment of the present invention provides the two-layer structure of the TiN layer 21 as a lower layer and the Ti layer 24 as an upper layer to serve as the anti-reflection films on the metal film for wiring formation 80, as in the case of the first embodiment of the present invention, so as to reduce the reflection (halation) of light from the metal film for wiring formation 80 when forming the photoresist pattern for delineating the respective high-potential-side wiring layers 81 and 82.

According to the second embodiment of the present invention, the three-layer structure of the TiN layer 21, the TiON layer 22, and the TiO layer 23 is selectively (locally) provided on the high-potential-side wiring layer 81 in the respective pad circumferential areas A31 and A32, so as to prevent a decomposition reaction at the circumference of the high-potential-side pads 81a and 82a or corrosion of the wiring layer. In addition, the two-layer structure of the TiN layer 21 and the high-concentration TiO layer 25 is selectively provided on the high-potential-side wiring layer 81 in the pad separation area A33, so as to avoid the separation during the manufacturing process and the degradation of external appearance. The thickness of the Ti layer 24 is preferably 10 nanometers or greater in view of suppression of the decomposition reaction in the high-potential-side pads.

Other Embodiments

As described above, the invention has been described according to the first and second embodiments, but it should not be understood that the description and drawings imple-menting a portion of this disclosure limit the invention. Various alternative embodiments of the present invention, examples, and operational techniques will be apparent to those skilled in the art from this disclosure.

For example, the first and second embodiments of the present invention illustrated above are not limited to the case of the semiconductor device using the Si substrate as the semiconductor substrate. The technical idea described in the first and second embodiments of the present invention may be applied to a semiconductor device using a semiconductor of a compound such as arsenic gallium (GaAs). The technical idea described in the first and second embodiments of the present invention may also be applied to a semiconductor device using a wide-bandgap semiconductor such as silicon carbide (SiC), gallium nitride (GaN), or diamond. The technical idea described in the first and second embodiments of the present invention may also be applied to a semiconductor device using a narrow-bandgap semiconductor such as indium antimonide (InSb) or semimetal.

The semiconductor device according to the first and second embodiments of the present invention illustrated above are not limited to the case of HVIC. For example, the technical idea described in the first and second embodiments of the present invention is particularly effective for a semiconductor device to which a high voltage of several tens of volts or more is applied.

What is claimed is:

1. A semiconductor device comprising:
   a wiring layer;
   a titanium nitride layer deposited on the wiring layer;
   a titanium oxynitride layer deposited on the titanium nitride layer;
   a titanium oxide layer deposited on the titanium oxynitride layer; and
   a surface passivation film deposited on the titanium oxide layer.

2. The semiconductor device of claim 1, wherein the wiring layer includes aluminum or an aluminum alloy.

3. The semiconductor device of claim 1, wherein the surface passivation film includes:
   a silicon oxide film deposited on the titanium oxide layer; and
   a silicon nitride film deposited on the silicon oxide film.

4. The semiconductor device of claim 1, wherein a total thickness of the titanium oxynitride layer and the titanium oxide layer is 30 nanometers or greater.

5. The semiconductor device of claim 1, wherein an opening penetrating the titanium nitride layer, the titanium oxynitride layer, the titanium oxide layer, and the surface passivation film is provided to expose a part of the wiring layer so as to serve as a pad.

6. The semiconductor device of claim 5, wherein the pad is a high-potential-side pad in a high voltage reference circuit.

7. The semiconductor device of claim 5, wherein:
   a three-layer structure including the titanium nitride layer, the titanium oxynitride layer, and the titanium oxide layer is selectively provided at a circumferential area of a pad; and
   a two-layer structure including the titanium nitride layer and a high-concentration titanium oxide layer is selectively provided at an area separated further from the pad than the circumferential area.

8. The semiconductor device of claim 5, wherein a three-layer structure including the titanium nitride layer, the titanium oxynitride layer, and the titanium oxide layer is provided adjacent to the opening.

* * * * *